United States Patent
Bapat et al.

(10) Patent No.: US 7,463,089 B1
(45) Date of Patent: Dec. 9, 2008

(54) CLASS D AUDIO POWER AMPLIFIER FOR MOBILE APPLICATIONS

(75) Inventors: Sumant Bapat, Santa Clara, CA (US); Ansuya Bhatt, Cupertino, CA (US); Christopher B. Heithoff, Sunnyvale, CA (US); Raminder Jit Singh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 187 days.

(21) Appl. No.: 11/460,937

(22) Filed: Jul. 28, 2006

(51) Int. Cl.
*H03F 3/88* (2006.01)

(52) U.S. Cl. ..................... 330/10; 330/207 A (58) Field of Classification Search ............ 330/10, 330/69, 136, 207, 251, 252, 255, 258; 363/41
See application file for complete search history.

(56) References Cited

U.S. PATENT DOCUMENTS 6,507,223 B2 * 1/2003 Felder .................. 327/77
6,937,091 B2 * 8/2005 Tanaka et al. ............. 330/10

OTHER PUBLICATIONS

U.S. Appl. No. 11/460,931, filed Jul. 28, 2006, Sumant Bapat et al.
LM4871 Boomer, "3W Audio Power Amplifier with Shutdown Mode," National Semiconductor Corporation, pp. 1-16, Jan. 2003.
LM4671 Boomer, "Filterless High Efficiency 2.5W Switching Audio Amplifier," National Semiconductor Corporation, pp. 1-18, Mar. 2005.

* cited by examiner

*Primary Examiner*—Robert Pascal
*Assistant Examiner*—Kheim D Nguyen
(74) *Attorney, Agent, or Firm*—Darby & Darby PC; Matthew M. Gaffney (57) ABSTRACT

A fully differential class D amplifier is provided. The class D amplifier includes an active amplifier in the feedback path of the modulator. In one embodiment, the class D amplifier includes a fully differential amplifier as an input buffer, in which a supply-independent reference voltage is used as the common mode voltage of the output of the fully differential amplifier. In one embodiment, the class D amplifier includes a pulse width modulation circuit that includes rail-to-rail comparators.

20 Claims, 7 Drawing Sheets

CLASS D AUDIO POWER AMPLIFIER FOR MOBILE APPLICATIONS

FIELD OF THE INVENTION

The invention is related to class D amplifiers, and in particular to a fully differential class D audio power amplifier with active feedback.

BACKGROUND OF THE INVENTION

In audio applications, a power amplifier is usually incorporated to drive a speaker load. The speaker load value typically varies from 4 ohm to 32 ohm. Traditionally, class AB amplifiers have been used to drive the speaker load. The main drawback of using class AB amplifiers is low efficiency. Low efficiency translates into more power dissipation inside the chip which in turn mandates using a heat sink to dissipate the heat and also lowers the battery life. This increases the cost and the area of the audio solution.

A class-D amplifier is attractive because of the higher power efficiency compared to a class AB amplifier, which realizes a longer battery life and eliminates the heat sink requirement. This allows design of compact and low cost multi-channel high-power systems. The class D amplifiers partially mitigate the concern of thermal runaway by using transistors as switches.

Class D amplifiers typically employ either pulse width modulation or sigma-delta modulation. The high frequency carrier signal (e.g. a triangle or a pulse waveform) is modulated by the audio input signal. This modulated signal is applied to the speaker by power transistors which are either completely on or completely off. This way the power dissipation is minimal inside these power transistors.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a class D amplifier. The class D amplifier includes an active amplifier in the feedback path of the modulator. In one embodiment, the class D amplifier includes a fully differential amplifier as an input buffer, in which a supply-independent reference voltage is used as the common mode voltage of the output of the fully differential amplifier. In one embodiment, the class D amplifier includes a pulse width modulation circuit that includes rail-to-rail comparators.

Figure 1:
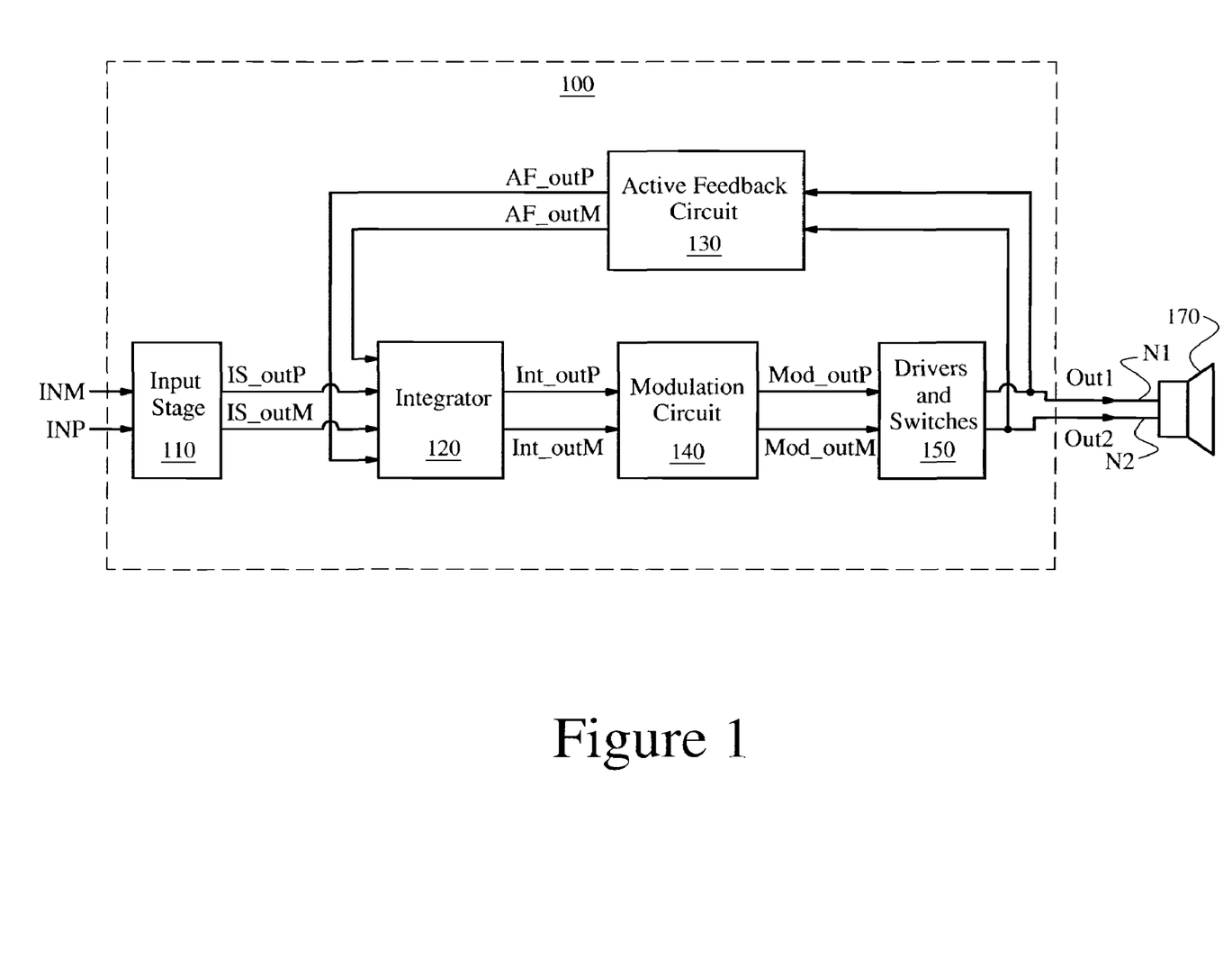
FIG. 1 shows a block diagram of an embodiment of a class D amplifier and a speaker.
Figure 3:
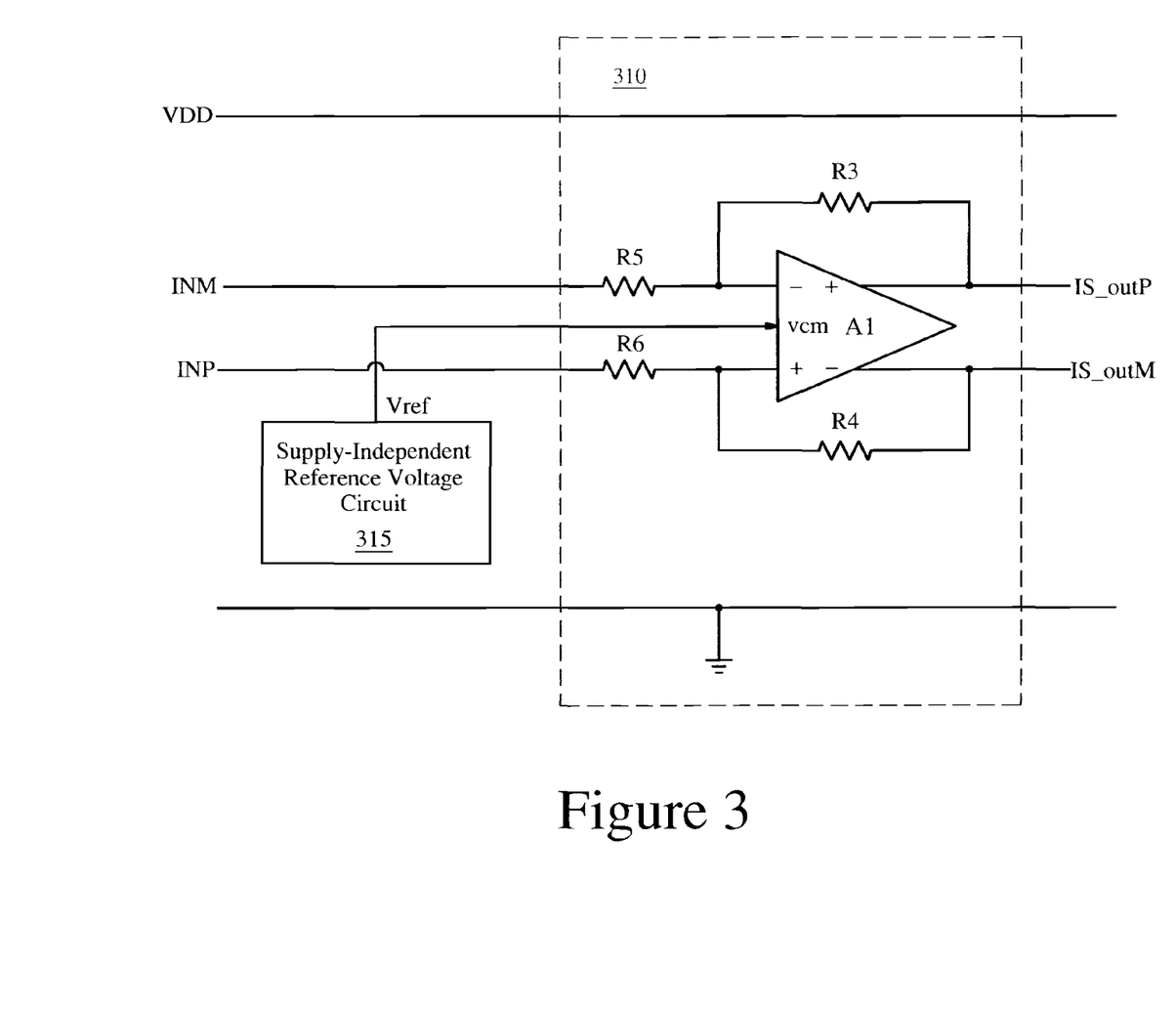
FIG. 3 shows a block diagram of an embodiment of a supply-independent reference voltage circuit and another embodiment of the input stage of FIG. 1.
Figure 4:
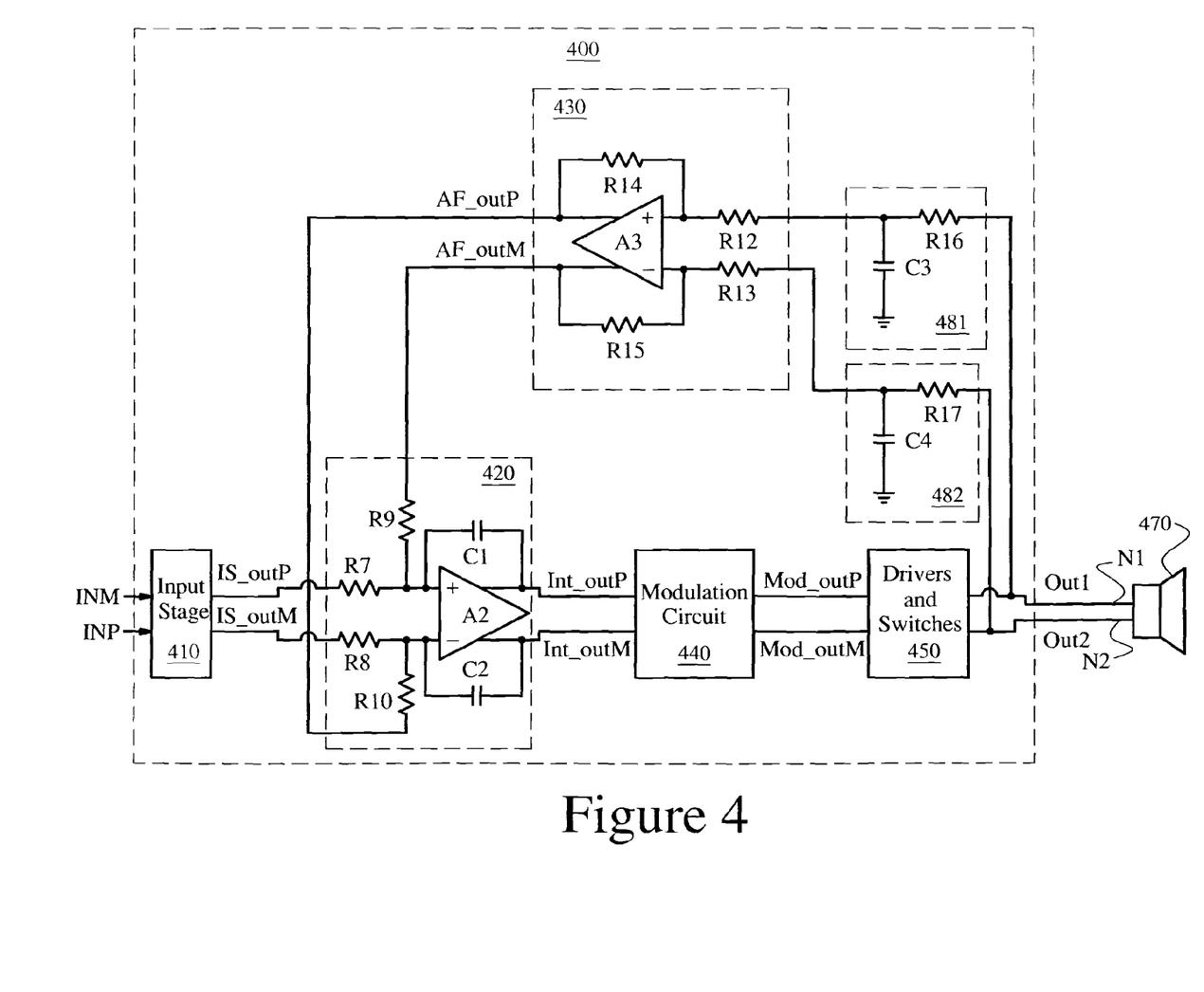
FIG. 4 illustrates a block diagram of an embodiment of the class D amplifier of FIG. 1.

FIG. 1 shows a block diagram of an embodiment of class D amplifier 100 and speaker 170. Class D amplifier 100 is operable to receive differential input signal IN, (where differential input signal IN includes signals INP and INM), and to provide class D differential output signal OUT (which includes signals OUT1 and OUT2) for driving speaker 170. Class D amplifier 100 may include input stage 110, integrator 120, active feedback circuit 130, modulation circuit 140, and driver and switches 150. Further, various embodiments may include more or less components that illustrated in FIG. 1. For example, in one embodiment, input stage 110 is not included in FIG. 1. In some embodiments, additional components may be included in class D amplifier 100, such as a supply-independent reference voltage circuit (as shown in FIG. 3 for one embodiment), and low-pass filters (as shown in FIG. 4 for one embodiment).

Input stage 110 may be operable to buffer differential input signal IN, to provide input stage output signal IS_OUT (which includes signals IS_outP and IS_outM). In some embodiments, input stage 110 also provides differential gain.

Additionally, active feedback circuit 130 is arranged to provide active feedback circuit output signal AF_out from class D amplifier output signal OUT (where signal AF_out is a differential signal that includes signals AF_outP and AF_outM). Active feedback circuit 130 is an active circuit rather than a passive circuit, and includes at least one active component, such as an op amp and/or the like.

Integrator 120 is arranged to integrate signal IS_out to provide integrator output signal Int_out (where signal Int_out is a differential signal that includes signals Int_outP and Int_outM). Signal IS_out is modified based on signal AF_out prior to the integration.

Also, modulation circuit 140 is arranged to provide modulation output signal Mod_out from signal Int_out, where signal Mod_out is a differential signal that includes signals Mod_outP and Mod_outM. In one embodiment, modulation circuit 140 is a pulse width modulation circuit that performs pulse width modulation on signal Int_out to provide signal Mod_out. In other embodiments, modulation circuit 140 may be a pulse frequency modulation circuit, a sigma-delta modulation circuit, or the like.

Drivers and switches 150 form a class D amplifier output stage that provides class D amplifier output signal OUT based on modulation output signal Mod_out. Signal OUT includes signals OUT1 and OUT2, which are provided at class D amplifier output nodes N1 and N2, respectively.

In one embodiment, differential signal IN is a differential audio input signal. In another embodiment, two or more differential audio signals are summed at the input of circuit 100 to provide signal IN. In another embodiment, signal INP is a single-ended audio signal, and INM is connected to ground or to a reference voltage. In another embodiment, two or more single-ended signals are summed to provide signal INP, and INM is connected to ground or to a reference voltage.

In one embodiment, all of the components illustrated in class D amplifier 100 are included in an integrated circuit. However, in other embodiments, some of the components shown in class D amplifier 100 are external to the integrated circuit. For example, in some embodiments, drivers and switches 150 are included in the integrated circuit. In other embodiments, drivers and switches 150 are external components.

Figure 2:
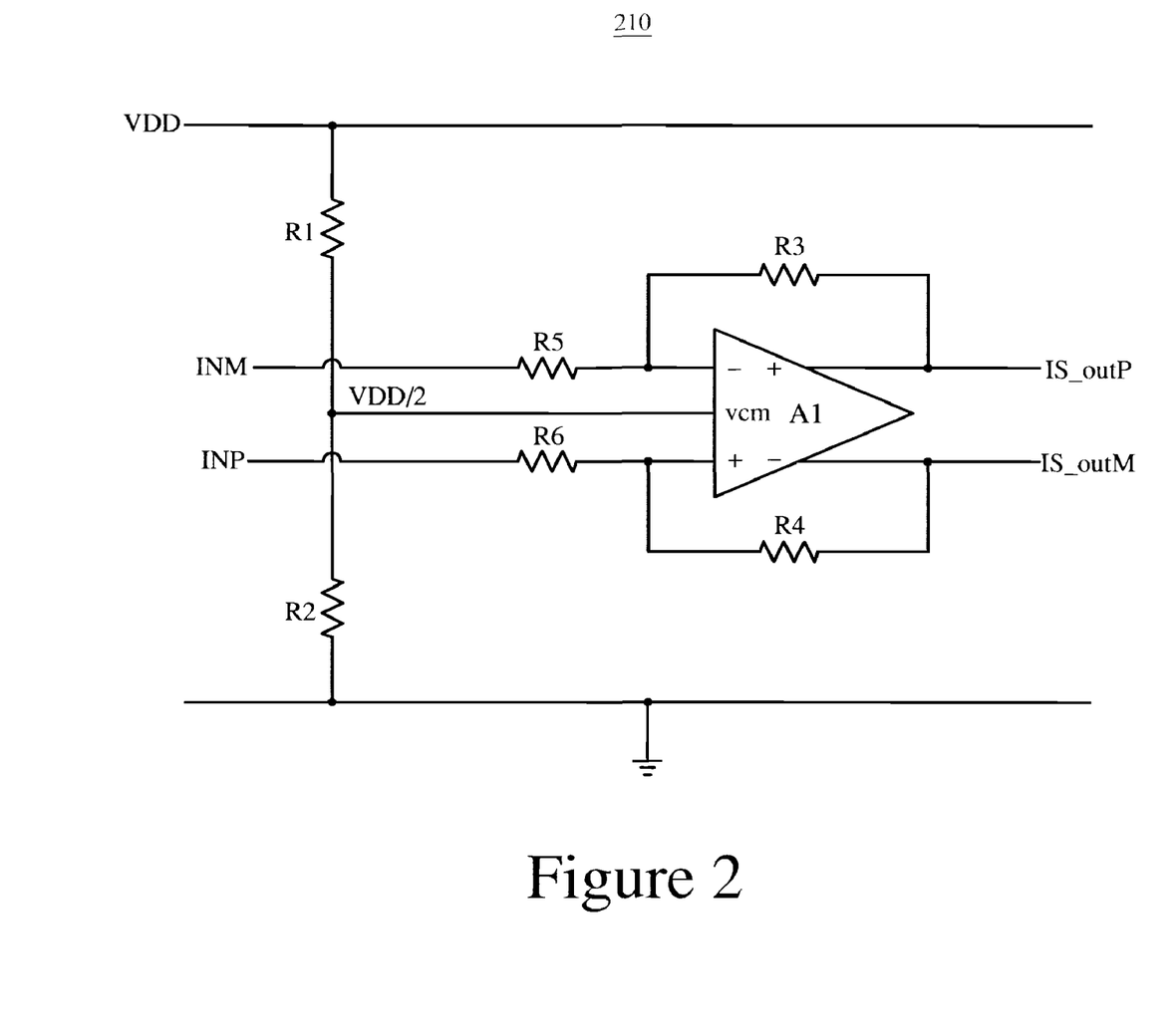
FIG. 2 illustrates a block diagram of an embodiment of the input stage of FIG. 1.

FIG. 2 illustrates a block diagram of an embodiment of input stage 210, which is an embodiment of input stage 110 of FIG. 1. Input stage 210 includes fully differential op amp A1 and resistors R1-R6. In one embodiment, some or all of the resistors are external components.

In one embodiment, resistors R1 and R2 operate to provide the common mode voltage input (vcm) of A1. In one embodiment, R1 and R2 have same resistance, so that the value of common mode voltage is equal to VDD/2. Fully differential amplifier 210 has a differential gain that is defined by resistors R3-R6. Additionally, the common mode voltage of signal IS_out is determined by the voltage provided at the common mode voltage input. That is, (IS_outP+IS_outM)/2 is substantially equal to the voltage provided at the common mode voltage input (vcm) of A1.

FIG. 3 shows a block diagram of supply-independent reference voltage circuit 315, which may be included in an embodiment of class D amplifier 100 of FIG. 1; and input stage 310, which may be employed as an embodiment of input stage 110 of FIG. 1. Input stage 310 operates as a fully differential amplifier that includes fully differential op amp A1 and resistors R3-R6. In one embodiment, some or all of the resistors are external components.

Supply-independent reference voltage circuit 315 is arranged to provide supply-independent reference voltage Vref to the common mode voltage input of fully differential op amp A1. In one embodiment, supply-independent reference voltage circuit 315 includes a bandgap reference circuit, and voltage Vref is a bandgap voltage or a scaled bandgap voltage. However, the invention is not so limited, and in various embodiments, various other techniques may be used for generating a supply-independent reference voltage.

In this way, supply voltage disturbances are not converted to differential output signals at the output of fully differential amplifier 310. For mobile applications, the power supply voltage VDD may have disturbances for a variety of different reasons. In an embodiment of class D amplifier 100 in which fully differential amplifier 310 and supply-independent reference voltage circuit 315 are included, class D amplifier 100 has high PSRR (power supply rejection ratio) which is almost independent of gain setting resistor mismatches.

FIG. 4 illustrates a block diagram of an embodiment of class D amplifier 400, which may be employed as an embodiment of class D amplifier 100 of FIG. 1. Class D amplifier 400 further includes low-pass filters 481 and 482. Low-pass filter 481 includes capacitor C3 and resistor R16. Similarly, low-pass filter 482 includes capacitor C4 and resistor R17. Also, integrator 420 includes op amp A2, capacitors C1 and C2, and resistors R7-R10. Active feedback circuit 430 includes op amp A3 and resistors R12-R15.

In one embodiment that is within the scope of the invention, resistors R16 and R10 may be combined as a single resistor, and resistors R9 and R17 may be combined as a single resistor. However, the use of separate resistors is preferred. Because op amp A3 is used for active feedback, separate resistors R16 and R10 may be used, and separate resistors R9 and R17 may be used. Accordingly, R16 may be used having a resistance selected for the low-pass filtering function, and R10 may be used as a resistance selected for the gain of active feedback circuit 430. Similarly, R17 may be used having a resistance selected for the low-pass filtering function, and R9 may be used as a resistance selected for the gain of active feedback circuit 430. This gives the flexibility of setting the gain and the low pass filter corner frequency separately.

By using op amp A3 in the feedback path, harmonic distortion of the class D amplifier is significantly reduced.

Figure 5:
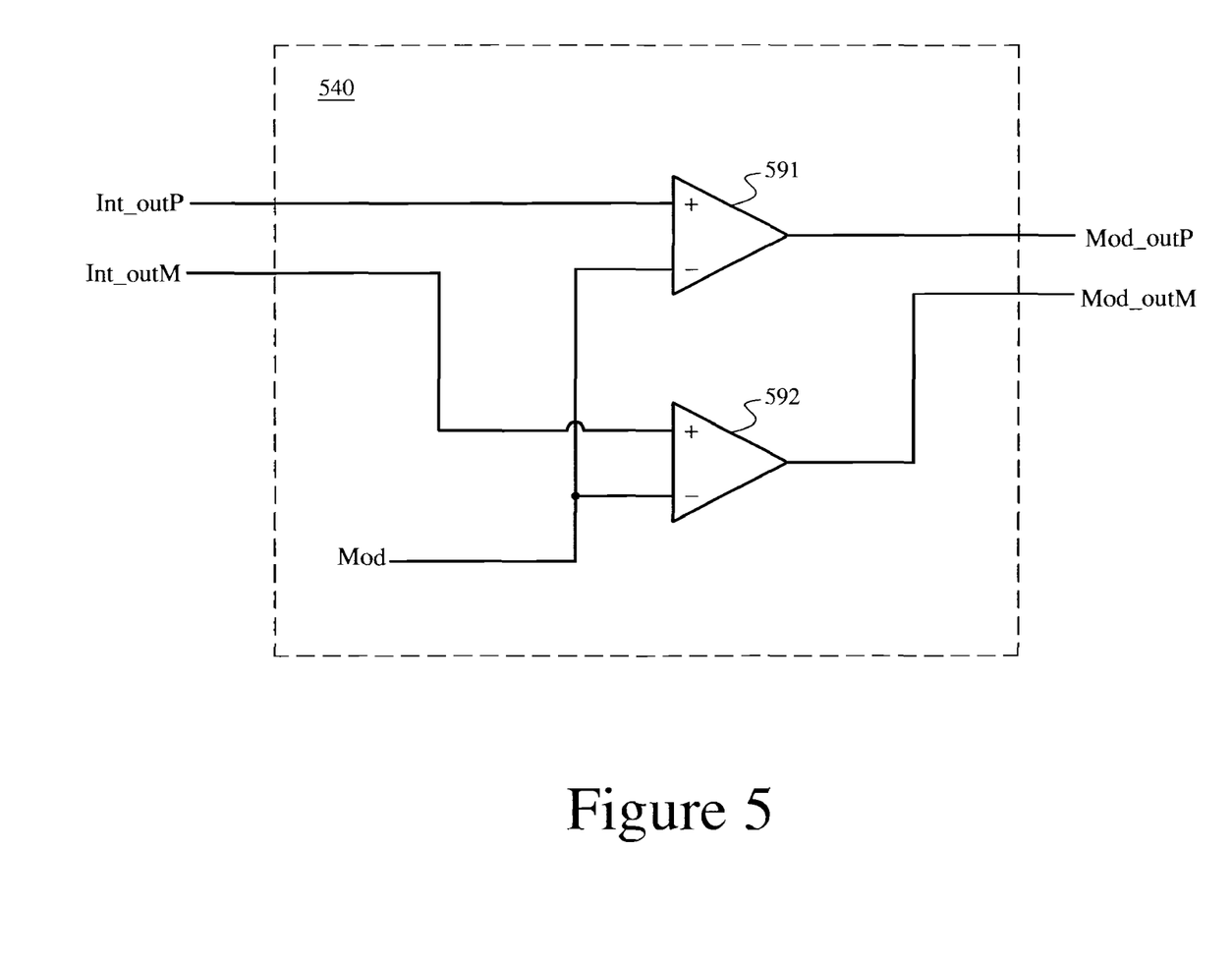
FIG. 5 shows a block diagram of an embodiment of the modulation circuit of FIG. 1 or FIG. 4.

FIG. 5 shows a block diagram of an embodiment of pulse width modulation circuit 540, which may be employed as an embodiment of modulation circuit 440 of FIG. 4, or of modulation circuit 140 of FIG. 1. Modulation circuit 540 includes comparators 591 and 592.

In one embodiment, modulating signal Mod is a triangle waveform. In other embodiments, signal Mod is a modulating waveform other than a triangle waveform. In one embodiment, pulse width modulation circuit 540 further includes a triangle waveform generation circuit (not shown) that generates signal Mod.

In one embodiment, comparators 591 and 592 are rail-to-rail comparators. However, the invention is not so limited, and comparators 591 and 592 need not be rail-to-rail comparators. In an embodiment in which rail-to-rail comparators are employed, the feedback loop is operational across full signal ranges, considerably improving harmonic distortion of the class D amplifier. Additionally, wider dynamic range, wider frequency operation, and wider supply operation is achieved.

Figure 6:
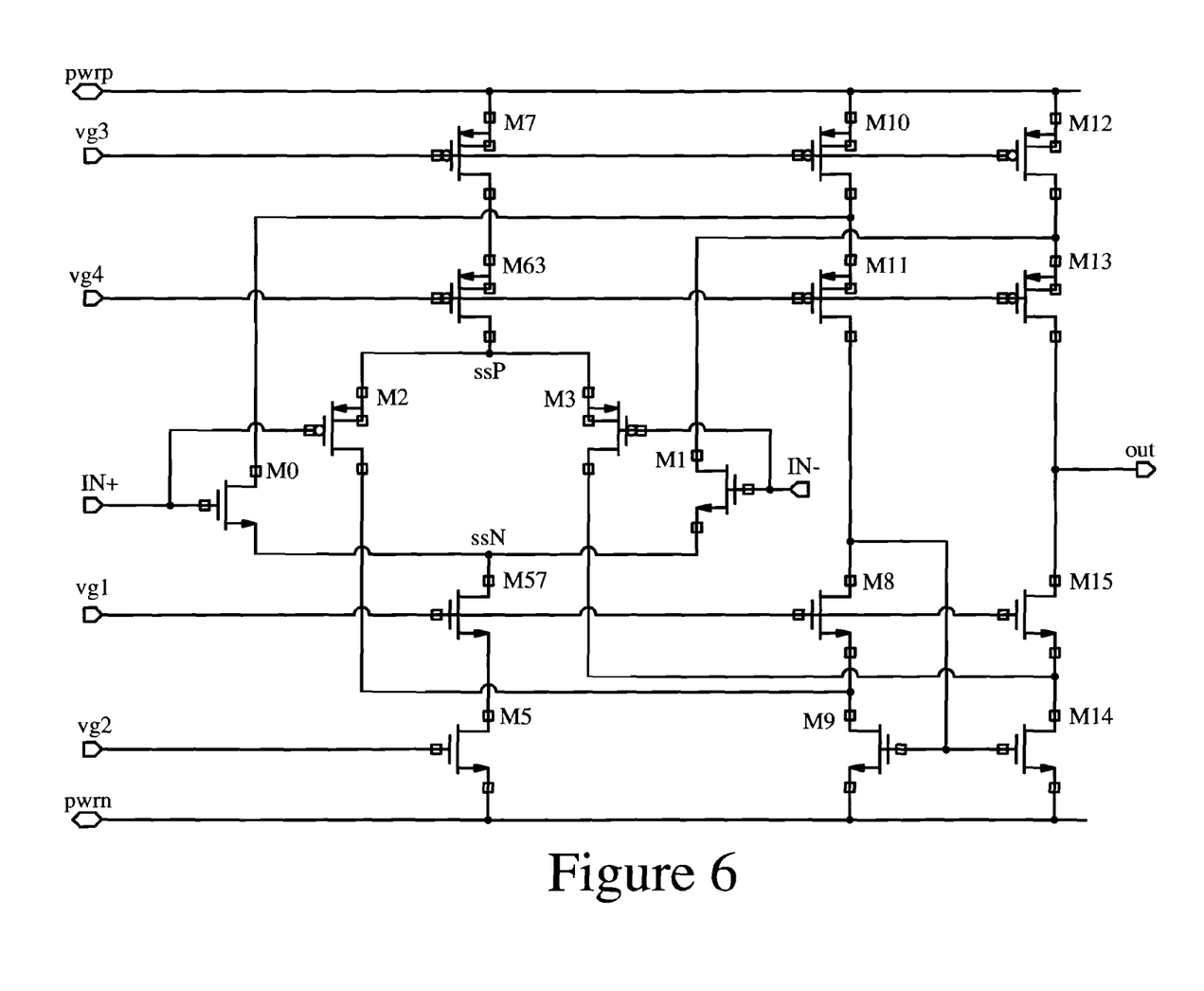
FIG. 6 schematically illustrates an embodiment of the comparator of FIG. 5.

FIG. 6 schematically illustrates an embodiment of rail-to-rail comparator 691, which may be used as an embodiment of rail-to-rail comparator 591 of FIG. 5. In one embodiment, rail-to-rail comparator 592 is substantially the same as rail-to-rail comparator 591.

Figure 7:
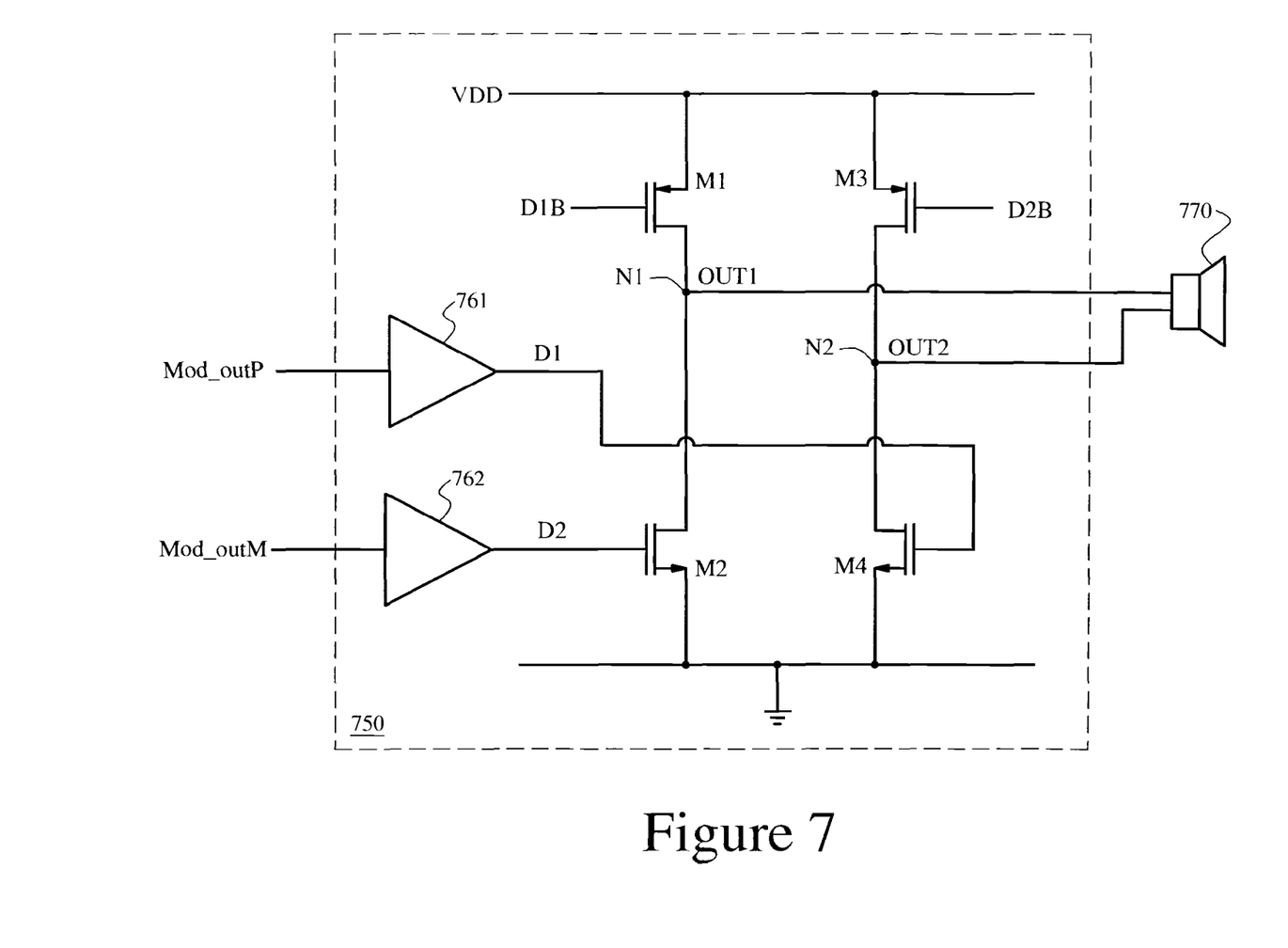
FIG. 7 schematically illustrates an embodiment of the drivers, switches, and speaker of FIG. 1 or FIG. 4, arranged in accordance with aspects of the present invention.

FIG. 7 schematically illustrates an embodiment of speaker 770 and drivers and switches 750, which may be employed as embodiment of speaker 470 and drivers and switches 450 of FIG. 4. In one embodiment, drivers and switches 750 include drivers 761 and 762, and power transistors M1-M4. However, various embodiments of drivers and switches 750 may include more or less components than are illustrated in FIG. 7.

Driver 761 is operable to provide driver output signal D1 from signal Mod_outP. Similarly, driver 762 is operable to provide driver output signal D2 from signal Mod_outM. In one embodiment, signal D1B is provided by an inverter (not shown) that provides signal D1B from signal D1. Similarly, in one embodiment, signal D2B is provided by another inverter (not shown) that provides signal D2B from signal D2.

Further, transistor M1 is arranged as a high-side switch that opens and closes responsive to signal D1B. Transistor M1 couples VDD to output node N1 if signal D1B is unasserted (i.e. signal D1 is asserted). Also, transistor M2 is arranged as a low-side switch that opens and closes responsive to signal D2. Transistor M2 couples GND to output node N1 if signal D2 is asserted. Transistor M3 is arranged as a high-side switch that opens and closes responsive to signal D2B. Further, transistor M3 couples VDD to output node N2 if signal D2B is unasserted (i.e. signal D2 is asserted). Transistor M4 is arranged as a low-side switch that opens and closes responsive to signal D1. Also, transistor M4 couples GND to output node N2 if signal D1 is asserted.

According to a first case, if signal D1 is asserted and signal D2 is unasserted, output node N1 is coupled to VDD and output node N2 is coupled to ground, so that speaker 770 is driven with a differential voltage of VDD. According to a second case, if signals D1 and D2 are both asserted, output node N1 is coupled to ground and output node N2 is coupled to ground, so that speaker 770 is driven with a differential voltage of zero. According to a third case, if signals D1 and D2 are both unasserted, output node N1 is coupled to VDD and output node N2 is coupled to VDD, so that speaker 770 is driven with a differential voltage of zero. According to a fourth case, if signal D2 is asserted and signal D1 is unasserted, output node N1 is coupled to ground and output node N2 is coupled to VDD, so that speaker 770 is driven with a differential voltage of –VDD.

Accordingly, drivers and switches 750 provide a three level switching scheme in which speaker 770 may be driver to three levels: VDD, 0, and –VDD. In an embodiment in which three-level switching is employed, the quiescent current when speaker 770 is connected is reduced relative to a two-level switching scheme. Also, by employing a three-level switching scheme, the output signal OUT provided to speaker 770 does not require any filtering. Accordingly, an output LC filter is not shown, because none is needed in this embodiment.

The embodiment of modulation circuit 540 illustrated in FIG. 5 and the embodiment of drivers and switches 750 illustrated in FIG. 7 may be used to provide a three-level switching scheme as discussed above. However, the invention is not so limited, and other embodiments may employ a two-level switching scheme.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A class D amplifier, comprising:
   a supply-independent reference voltage generation circuit having at least an output;
   a fully differential amplifier having at least a first input, a second input, a common mode voltage input, a first output, and a second output, wherein the common mode voltage input is coupled to the output of the supply-independent reference voltage generation circuit;
   an integrator having at least a first input, a second input, a first output, and a second output, wherein the first input of the integrator is coupled to the first output of the fully differential amplifier, the second input of the integrator is coupled to the second output of the fully differential amplifier, and wherein the integrator includes a first op amp having at least a first input and a second input;
   a modulation circuit having a first input and a second input, wherein the first input of the pulse modulation circuit is coupled to the first output of the integrator, and wherein the second input of the pulse modulation circuit is coupled to the second output of the integrator; and
   an active feedback circuit having at least a first input, a second input, a first output, and a second output, wherein the first input of the active feedback circuit is coupled to a first class D amplifier output node, the second input of the active feedback circuit is coupled to a second class D amplifier output node, the first output of the active feedback circuit is coupled to the first input of the first op amp, and the second output of the active feedback circuit is coupled to the second input of the first op amp.

2. The class D amplifier of claim 1, further comprising:
   a plurality of driver circuits that are coupled to the modulation circuit; and
   a plurality of switches that are coupled to the plurality of driver circuits, and further coupled to the first and second class D amplifier output nodes.

3. The class D amplifier of claim 1, wherein
   the class D amplifier is operable to provide a differential class D amplifier output signal to a speaker;
   the supply-independent reference voltage is arranged to provide a supply-independent reference voltage at the output of the supply-independent reference voltage circuit;
   the fully differential amplifier is arranged to receive a differential input voltage across the first and second input of the differential amplifier, to receive the supply-independent reference voltage at the common mode input of the fully differential amplifier, and to provide a fully differential amplifier output voltage across the first and second output of the fully differential amplifier, such that the fully differential amplifier output voltage is based, in part, on the differential input voltage, and such that the common mode voltage of the fully differential amplifier output voltage is substantially equal to the supply-independent reference voltage;
   the active feedback circuit is arranged to receive the class D amplifier output signal across the first and second inputs of the active feedback circuit, and to provide a differential active feedback circuit output signal across the first and second outputs of the active feedback circuit;
   the integrator is arranged to receive the fully differential input signal across the first and second inputs of the integrator, and to provide an integrator output signal across the first and second outputs of the integrator, wherein the integrator output signal is based, in part, on the fully differential amplifier output signal; and further based, in part, on the active feedback circuit output signal;
   the modulation circuit is arranged to receive the integrator output signal across the first and second inputs of the modulation circuit, and to provide a modulation circuit output signal, wherein the class D amplifier output signal is based, in part, on the modulation circuit output signal.

4. The class D amplifier of claim 1, wherein the supply-independent reference voltage generation circuit is arranged to provide a supply-independent reference voltage at the output of the supply-independent reference voltage generation circuit, the supply-independent reference voltage generation circuit includes a bandgap reference that is arranged to provide a bandgap voltage, and wherein the supply-independent reference voltage generation is based, at least in part, on the bandgap voltage.

5. The class D amplifier of claim 1, wherein the modulation circuit is a pulse width modulation circuit.

6. The class D amplifier of claim 5, wherein the pulse width modulation circuit includes:
a first comparator having at least a first input that is coupled to the first output of the integrator, a second input, and a first output; and
a second comparator having at least a first input that is coupled to the second output of the integrator, a second input, and a first output.

7. The class D amplifier of claim 6, wherein the first comparator is a rail-to-rail comparator.

8. The class D amplifier of claim 7, wherein the second comparator is another rail-to-rail comparator.

9. The class D amplifier of claim 1, wherein the active feedback circuit includes a second op amp.

10. The class D amplifier of claim 9, further comprising:
a first low-pass filter that is coupled between the first output node and a first input of the second op amp; and
a second low-pass filter that is coupled between the second output node and a second input of the second op amp.

11. The class D amplifier of claim 10, wherein
the active feedback circuit further includes:
a first resistor that is coupled between the first low-pass filter and the first input of the second op amp; and
a second resistor that is coupled between the second low-pass filter and the second input of the second op amp;
the first low-pass filter includes a third resistor; and
wherein the second low-pass filter includes a fourth resistor.

12. A class D amplifier, comprising:
an integrator having at least a first input, a second input, a first output, and a second output, wherein the integrator includes a first op amp having at least a first input and a second input;
a pulse width modulation circuit, including:
a first rail-to-rail comparator having at least a first input that is coupled to the first output of the integrator, a second input, and a first output; and
a second rail-to-rail comparator having at least a first input that is coupled to the second output of the integrator, a second input, and a first output; and
an active feedback circuit having at least a first input, a second input, a first output, and a second output, wherein the first input of the active feedback circuit is coupled to a first class D amplifier output node, the second input of the active feedback circuit is coupled to a second class D amplifier output node, the first output of the active feedback circuit is coupled to the first input of the first op amp, and the second output of the active feedback circuit is coupled to the second input of the first op amp.

13. The class D amplifier of claim 12, wherein
the second input of the first rail-to-rail comparator is coupled to the second input of the second rail-to-rail comparator.

14. The class D amplifier of claim 12, wherein
the pulse width modulation circuit further includes a triangle waveform generation circuit that is coupled to the second input of the first rail-to-rail comparator, and further coupled to the second input of the second rail-to-rail comparator.

15. The class D amplifier of claim 12, further comprising:
a plurality of driver circuits that are coupled to the pulse width modulation circuit; and
a plurality of switches that are coupled to the plurality of driver circuits, and further coupled to the first and second first class D amplifier output nodes.

16. The class D amplifier of claim 15, wherein the pulse width modulation circuit and the plurality of switches are arranged for at least three-level switching, such that the class D amplifier is capable of driving a speaker load to at least three voltage levels: VDD, 0, and −VDD.

17. The class D amplifier of claim 12, further comprising:
an input stage that is coupled to the first input of the integrator and the second input of the integrator.

18. The class D amplifier of claim 17, wherein
the input stage includes a fully differential amplifier having at least a first input, a second input, a common mode voltage input, a first output, and a second input.

19. The class D amplifier of claim 18, further comprising:
a supply-independent reference voltage generation circuit having at least an output, wherein the output of the reference voltage circuit is coupled to the common mode voltage input of the fully differential amplifier, and wherein the supply-independent reference voltage circuit is arranged to provide a supply-independent output voltage at the output of the supply-independent reference voltage generation circuit.

20. A class D amplifier, comprising:
a supply-independent reference voltage generation circuit having at least an output;
a fully differential amplifier having at least a first input, a second input, a common mode voltage input, a first output, and a second output, wherein the common mode voltage input is coupled to the output of the supply-independent reference voltage generation circuit;
an integrator having at least a first input, a second input, a first output, and a second output, wherein the first input of the integrator is coupled to the first output of the fully differential amplifier, the second input of the integrator is coupled to the second output of the fully differential amplifier, and wherein the integrator includes a first op amp having at least a first input and a second input;
a pulse width modulation circuit, including:
a first rail-to-rail comparator having at least a first input that is coupled to the first output of the integrator, a second input, and a first output; and
a second rail-to-rail comparator having at least a first input that is coupled to the second output of the integrator, a second input, and a first output; and
an active feedback circuit having at least a first input, a second input, a first output, and a second output, wherein the first input of the active feedback circuit is coupled to a first class D amplifier output node, the second input of the active feedback circuit is coupled to a second class D amplifier output node, the first output of the active feedback circuit is coupled to the first input of the first op amp, and the second output of the active feedback circuit is coupled to the second input of the first op amp.

* * * * *